Figure 1:
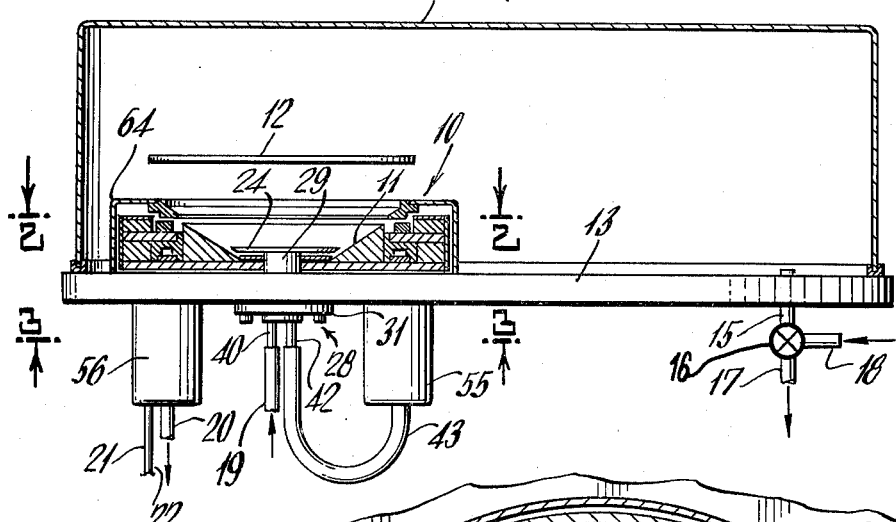

| United States Patent [19] | [11] | 4,060,470 |
|---|---|---|
| Clarke | [45] | Nov. 29, 1977 |

[54] SPUTTERING APPARATUS AND METHOD

[76] Inventor: Peter J. Clarke, 760 Arcady Road, Santa Barbara, Calif. 93108

[21] Appl. No.: 642,455

[22] Filed: Dec. 19, 1975

Related U.S. Application Data

[63] Continuation-in-part of Ser. No. 530,069, Dec. 6, 1974, abandoned.

[51] Int. Cl.² ............................................. C23C 15/00
[52] U.S. Cl. ............................ 204/192 R; 204/192 M; 204/298
[58] Field of Search ............................... 204/192, 298

[56] References Cited

U.S. PATENT DOCUMENTS

| 2,239,642 | 4/1941 | Burkhardt et al. | 204/192 |
| 3,669,860 | 6/1972 | Knowles et al. | 204/192 |
| 3,878,085 | 4/1975 | Corbani | 204/298 |

FOREIGN PATENT DOCUMENTS

| 1,690,689 | 3/1972 | Germany | 204/298 |
| 1,358,411 | 7/1974 | United Kingdom | 204/192 |

OTHER PUBLICATIONS

J. R. Mullaly, "Crossed Field Discharge Device for High Rate Sputtering," *Research/Development*, Feb. 1971, pp. 40–43.

Primary Examiner—Donald L. Walton
Assistant Examiner—Aaron Weisstuch
Attorney, Agent, or Firm—Lowhurst & Aine

[57] ABSTRACT

The sputtering apparatus includes a concentric anode and cathode electrode and a magnetic structure for producing a magnetic field crossed with the electric field (magnetron type discharge) over the cathode region to be sputtered for enhancing the sputtering operation. The magnetic structure includes field shaping means, such as shunts or bucking magnets, to limit the cathode dark space substantially to the effective sputter surface of the cathode. A ground shield surrounding the cathode, but not extending into the dark space, is utilized to contribute to the effect produced by the magnetic field, and means are provided for cooling the anode and cathode. In the case of sputtering ferromagnetic material, a ferromagnetic sputter cathode has its thickness dimensioned so as to be magnetically saturated by the applied magnetic field in a region of relatively low sputter erosion and to be thicker in regions of more intense sputter erosion.

26 Claims, 12 Drawing Figures

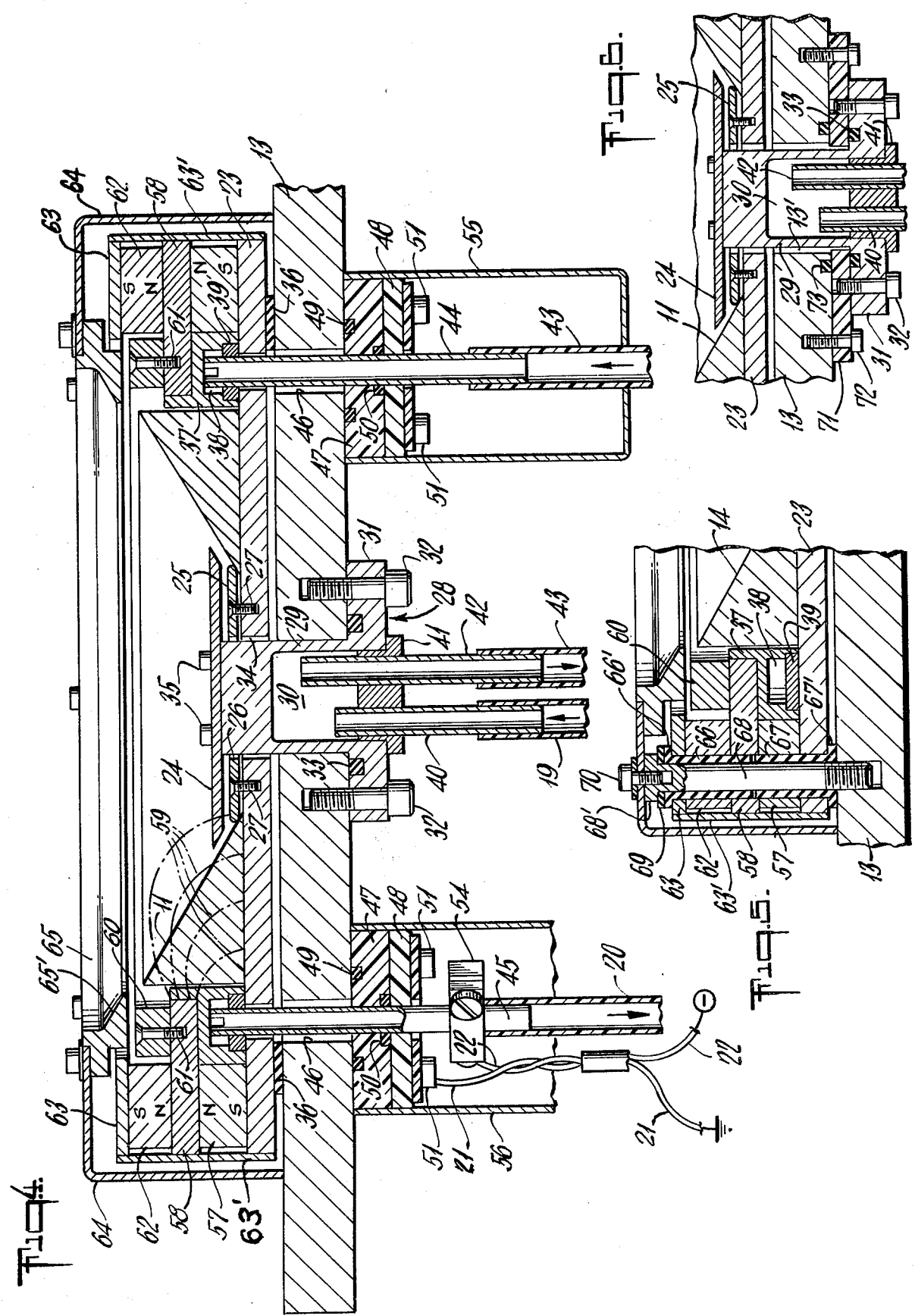

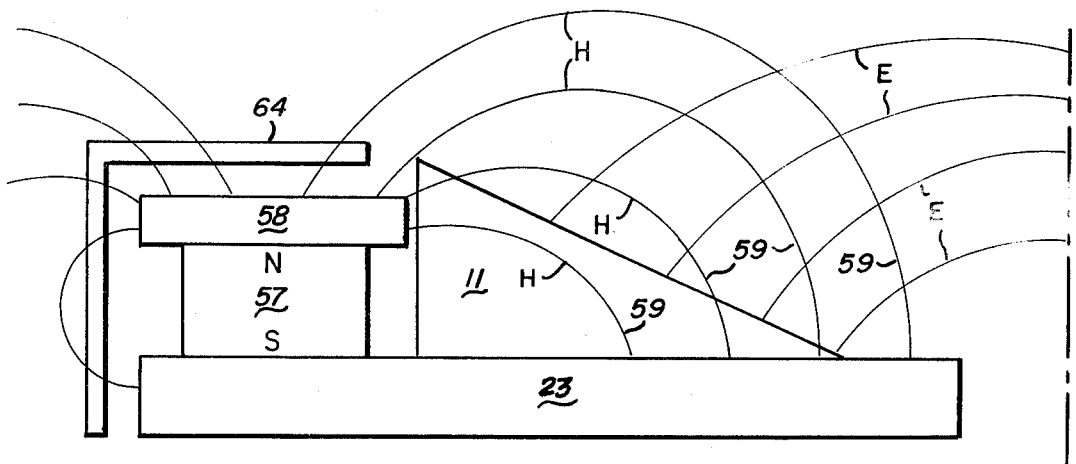
Fig_7
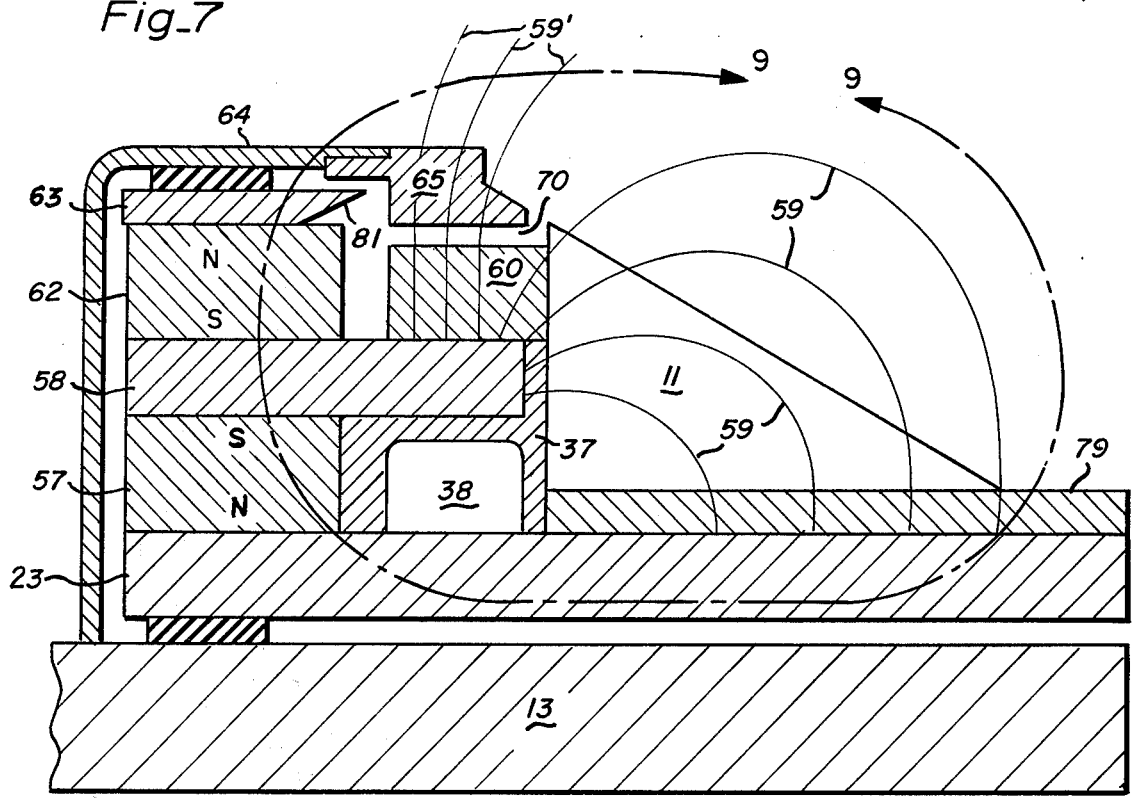
Fig_8
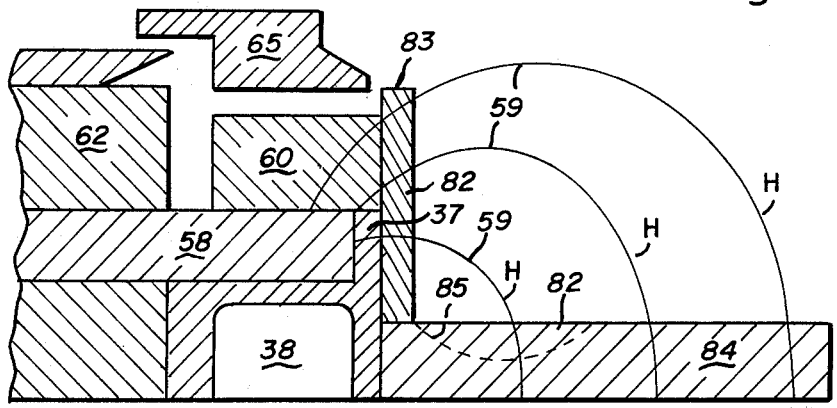
Fig_9

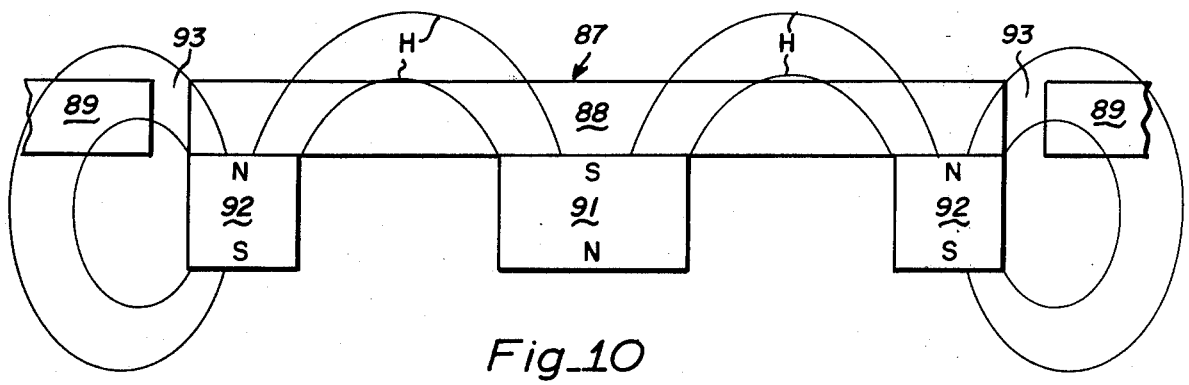
Fig_10
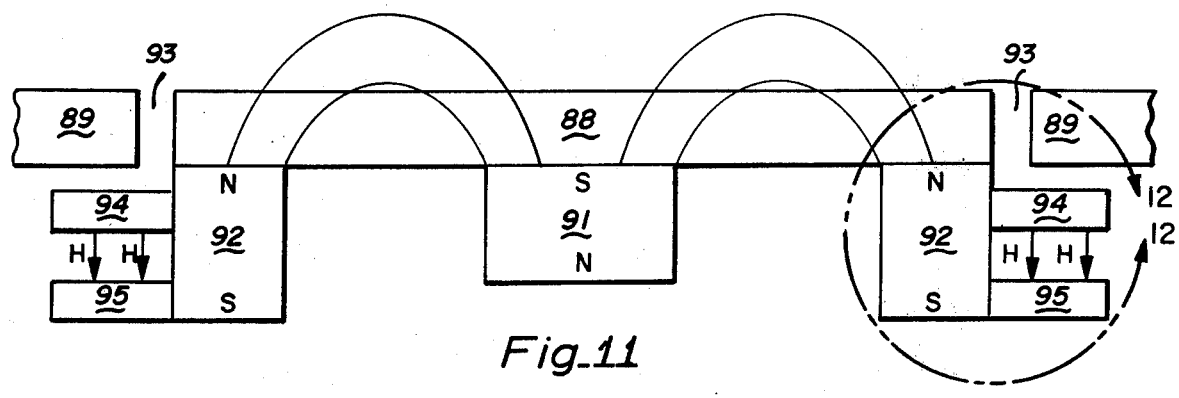
Fig_11
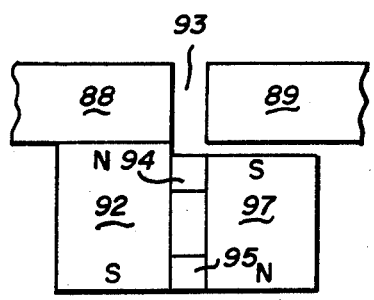
Fig_12

SPUTTERING APPARATUS AND METHOD

RELATED CASES

The present application is a continuation-in-part application of parent U.S. Ser. No. 530,069 filed Dec. 6, 1974, now abandoned.

This invention relates to sputtering apparatus and, more specifically, a novel and improved apparatus and the application of potentials thereto for sputtering material from a cathode to a work piece under the influence of electric and magnetic fields and wherein means are provided to insure transfer of material only from the cathode to the work piece and at the same time prevent excessive cathode temperatures.

Sputtering devices utilizing electric and magnetic fields are disclosed in U.S. Pat. Nos. 3,616,450 and 3,711,398 and this invention constitutes an improvement of those devices and affords not only the advantages referred to above but also provides effective utilization of the cathode (or sputtered) material.

In the sputtering of materials it is desirable to provide a relatively wide angle of emergence of the sputtered material from the head but in so doing material is sputtered from structural members surrounding the cathode with the result that an alloy containing material from both the cathode and the structural members is deposited on the work piece. This invention provides a novel and improved arrangement and organization of elements forming the sputtering head which limits the sputtering action solely to the cathode, and at the same time emits the sputtered material throughout an exceedingly wide angle.

Still another object of the invention resides in the provision of a novel and improved magnetic structure for a sputtering head which provides a controlled magnetic field which limits the sputtering solely from the cathode.

Still another object of the invention includes the provision of a shield in combination with the improved magnetic field which aids in restricting the dark space to the cathode with the result that sputtering can be accomplished at very low pressures of the order of $2 \times 10^{-3}$ torr.

A further object of the invention resides in the provision of novel and improved cathode cooling means.

A still further object of the invention resides in novel and improved sputtering apparatus.

In another feature of the present invention, the cathode is made of ferromagnetic material to be sputtered and is operated in magnetically saturated mode in at least one portion thereof to assist in passing the magnetic field therethrough into a crossed magnetic and electric field glow discharge field over the surface of the cathode to be sputtered.

The sputtering apparatus in accordance with the invention comprises a relatively shallow cathode surrounded by a magnetic structure which functions in cooperation with an electric field to produce a cathode dark space at very low pressures which encompasses only the cathode surface whereby only material from the cathode will be deposited on the work piece. At the same time cooling means are provided to prevent overheating of the cathode.

The above and other objects and advantages of the invention will become more apparent from the following description and accompanying drawings forming part of this application.

IN THE DRAWINGS

Figure 2:
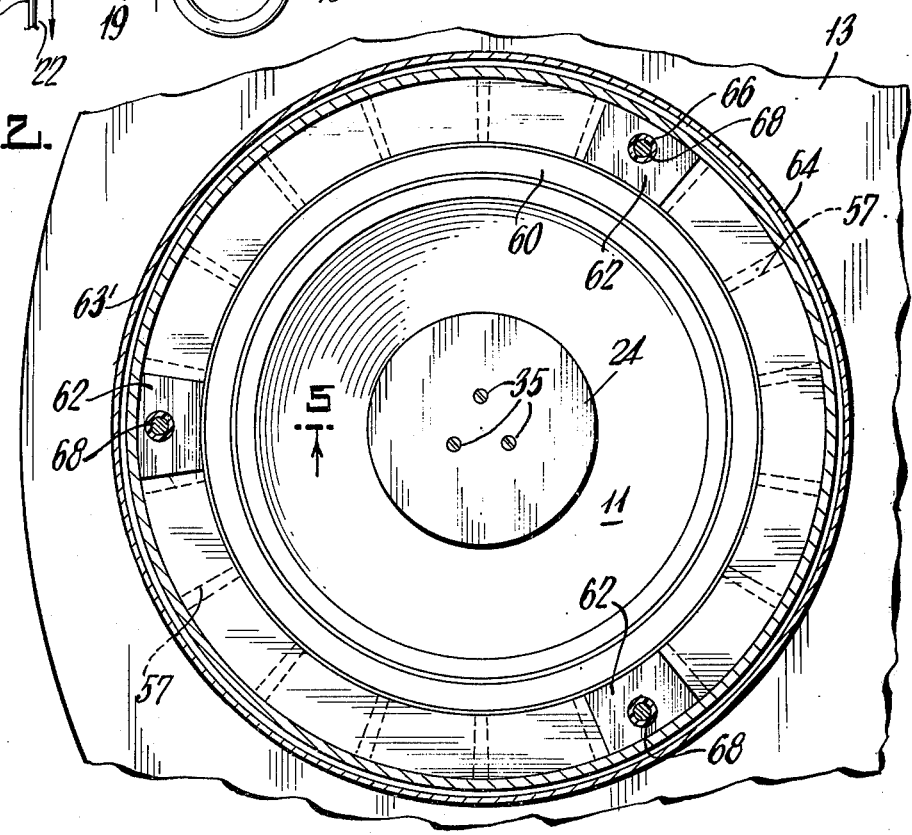
Figure 3:
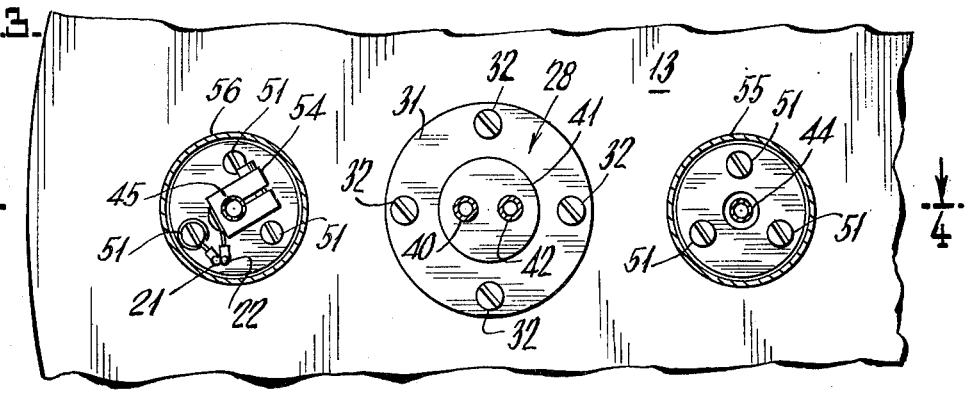

FIG. 1 is a side elevational view in partial section of apparatus in accordance with the invention, FIG. 2 is a cross-sectional view of FIG. 1 taken along the line 2-2 thereof, FIG. 3 is a cross-sectional view of FIG. 1 taken along the line 3-thereof, FIG. 4 is a cross-sectional view of FIG. 3 taken along the line 4—4 thereof, FIG. 5 is a cross-sectional view of FIG. 2 taken along line 5—5 thereof, FIG. 6 is a fragmentary section of apparatus similar to FIG. 5 showing a modified embodiment of the invention, FIG. 7 is a schematic line diagram of a view similar to that of FIG. 5 depicting the mode of operation of a similar structure which does not include the magnetic field shaping feature of the present invention, FIG. 8 is an enlarged view, similar to that of FIG. 5, depicting the shapes of the magnetic field lines and explaining the mode of operation of the present invention, FIG. 9 is a detail view of a portion of the structure of FIG. 8 delineated by line 9—9 and showing an alternative ferromagnetic sputter cathode structure;

FIG. 10 is a schematic line diagram of an alternative sputter cathode apparatus employing a magnetically enhanced sputter glow discharge, FIG. 11 is a view similar to that of FIG. 10, depicting an alternative embodiment of the present invention, and FIG. 12 is an enlarged detailed view of a portion of the structure of FIG. 11 depicting an alternative embodiment thereof.

Sputtering apparatus in accordance with the invention is based upon the principle of utilizing a glow discharge in a partially evacuated atmosphere and at the same time employing controlled magnetic fields to produce a cathode dark space which encompasses only the cathode area so that the sputtered material shall be only that of which the cathode is formed.

Referring now to the drawings and more specifically to FIG. 1, the apparatus in accordance with the invention includes a sputtering head 10 having a cathode 11 facing upwardly toward the work piece 12 to be coated, the latter being supported in any suitable manner. The head 10 is carried by a base plate 13 and the head and work piece are enclosed by a bell or dome 14 sealed about the edge of the plate 13. A conduit 15 extends through the base plate 13 and is coupled with valving means 16 for withdrawal of air from the dome 14 through the outlet conduit 17 and the admission of a suitable gas through the conduit 18. Cooling water inlet and outlet hoses 19 and 20 also extend from the head 10 along with electrical conductors 21 and 22.

The detailed structure of the head 10 is illustrated in FIGS. 2 through 5 and includes an annular plate 23 carrying cathode 11 and an anode 24 disposed centrally of the cathode.

The cathode 11 in the instant embodiment of the invention consists of an annular structure of triangular section which tapers downwardly and inwardly from the outer edge as viewed in FIG. 4 to form an enlarged central opening. A cathode retainer plate 25 has a central opening 26 and an outside diameter that will enable it to rest against the inner portion of the cathode taper so that upon insertion of screws 27 the cathode 11 will be held firmly in position against the base plate 23. The anode 24 is in the form of an annular plate carried by a central support generally denoted by the numeral 28 and comprising a cylindrical portion 29 having a recess 30 therein and an annular flange 31 seated against the bottom of the plate 13 and held in place by the screws 32. An annular seal 33 disposed between the flange 31 and the plate 13 prevents leakage of air when the dome 14 is evacuated. The opening 34 in the plate 23 and the opening 26 in the plate 25 are substantially larger in diameter than the anode support portion 29 so that they are electrically insulated therefrom. The anode 24 is secured to the top of the anode support portion 29 by screws 35 and is positioned in spaced relationship to the cathode 11 and the retainer plate 25 therefor.

The plate 23 carrying the cathode 11 is spaced from the plate 13 by insulating members 36 and is fixedly secured to plate 13 in a manner to be described in connection with FIG. 5.

A non-magnetic water jacket 37 surrounds the cathode 11 and is spaced slightly therefrom to facilitate assembly and permit expansion of the cathode during the sputtering process. The spacing however, is sufficiently small so that upon expansion of the cathode it will contact the water jacket in order to effect heat transfer from the cathode to the jacket. The water jacket includes an annular recess 38 in the underside thereof which is closed by a ring 39 to form an annular channel. Cooling water or other suitable liquid is fed through hose 19 and conduit 40 into recess 30 which is closed by plug 41 to cool the anode assembly, flows out of the recess 30 through conduit 42 and tube 43 to conduit 44 communicating with the recess 38 in the cathode cooling ring 37. The liquid flows about the annular recess or channel 38 and is discharged through the conduit 45 and hose 20.

The conduits 44 and 45 are formed of electrically conductive material and are insulated from the plate 13 and electrically connected to the cathode 11 through the cooling ring 37 and the plate 23. More specifically the tubes 44 and 45 each extend through an enlarged opening 46 in the plate 13 and are electrically connected to the cooling ring 37. Two individual insulating members 47 and 48 surround each tube and seals 49 and 50 prevent loss of vacuum within the dome or bell 14. The insulating members 47 and 48 are secured to the plate 13 by bolts 51 with one of the bolts 51 associated with conduit 45 having a conductor 21 connected thereto for grounding the plate 13 and anode 24. A second conductor 22 having a negative potential applied thereto is connected to tube 20 by a clamp 54 to apply the negative potential to the cathode. Protective shields 55 and 56 surround and enclose at least portions of conduits 44 and 20 and associated mounting members.

The magnetic circuit surrounds the cathode 11 and non-magnetic cooling ring 37 and includes a plurality of individual spaced magnets 57 polarized, in the illustrated embodiment, with the south poles resting against the plate 23 and the north poles facing upwardly. A single annular north pole piece 58 overlies the magnets 57. These magnets produce a flux path as generally indicated by the flux lines 59 and cooperate with the electric field to effect the sputtering operation. An annular clamp ring 60 overlies part of the pole piece 58 and is secured thereto by screws 61.

With the arrangement thus far described, the cathode dark space will not only encompass the cathode but also ring 60 and the pole piece 58. As a result, material from the ring and pole piece will be sputtered along with material from the cathode. While the area that can be sputtered is greatly increased because the cathode is close to the surface and therefore delivers material over a very much wider angle, it may be desirable to use appropriate shielding to insure restriction of the dark space solely to the cathode. An improved procedure for the attainment of that end embodies the utilization of an additional magnetic field and cooperating shielding means. Such an arrangement is shown more clearly in FIGS. 2 and 4.

The additional magnetic field is provided by a plurality of additional magnets denoted by the numeral 62. While any suitable number of magnets may be used, in this instance three magnets are positioned at 120° intervals about the top side of pole piece 58 and have about the same characteristics as the magnets 57. By polarizing magnets 62 in a direction opposite to that of magnets 57, the magnetic field produced by magnets 57 is compressed and most of the flux lines emerge from the inner edge of pole piece 58. This procedure avoids the need for a conventional ground shield which requires an undesirable increase in pressure to avoid extinguishing the glow discharge.

In order to further restrict or compress the principal magnetic field an annular L-shaped shield 63 overlies the top of magnets 62 and extends downwardly to enclose the outer periphery of the magnetic structure. While this arrangement is most effective in restricting the dark space to the cathode area, an improved ground shield comprising an annular L-shaped member 64 and a ring 65 carried thereby may be used without adversely affecting the pressure required to maintain the glow discharge. The ring 65 is shaped to conform with the cathode dark space but not interfere with it. It will be observed that ring 65 has an inner diameter slightly greater than the outside diameter of cathode 11 and has a slope 65' on the inner edge which is substantially parallel to the slope of the cathode.

The elements of the sputtering device as described above are held in position by at least three mounting studs as illustrated in FIGS. 2 and 5. Referring more specifically to FIG. 5, the magnetic assembly has holes bored therein to receive abutting sleeves 66 and 67 each having flanges 66' and 67' on the outer ends thereof. The sleeves are formed of insulating material and serve to insulate the non-magnetic bolt 68 from the cathode assembly and the plate 23 from the plate 13. If desired, a washer 69 may be used beneath the head 68' of bolt 68 to avoid damage to the sleeve 66 and the bolt threadably engages an opening in the plate 13. The head 68' of bolt 68 has a threaded opening therein to receive screws 70 to secure the shield 64 and attached ring 65 in place.

A modified embodiment of the invention is illustrated in FIG. 6 which is a cross-sectional view of an anode structure similar to that shown in FIG. 4. Accordingly, like numerals have been used to denote like elements in each figure. In this form of the invention the opening 13' in the plate 13 is enlarged to completely clear the anode support 29. An insulating member 71 is disposed between the support flange 31 and screws 32 secure the support flange to the insulating member. The latter is then secured to the plate 13 by screws 72. In this way the anode can be separately polarized.

In the operation of the apparatus illustrated in FIG. 4 the anode is made positive with respect to the cathode and a potential difference of about 500 volts has been found effective and gas pressures as low as $2 \times 10^{-3}$ torr can be utilized and still maintain the glow discharge.

With the structure shown in FIG. 6 the anode 24 can be separately polarized to maintain the electron current through the anode substantially equal to the ion current for more efficient operation and reduces radiation damage to sensitive semiconductor devices. It has been found that potentials of the order of 6 to 40 volts positive with respect to the potential of plate 13 has been found effective for this purpose. In normal operation the plate 13 is connected to ground and the cathode is at about 500 volts negative. With the floating anode of FIG. 6 the anode is positive with respect to ground.

The bucking magnetic field produced by the bucking magnet 62 in the embodiment of FIGS. 1-6, described above, is for the purpose of suppressing a stray magnetron glow discharge otherwise produced in the region between the shield 64 and the upper pole piece 58, as indicated in FIG. 7. More particularly, in the structure of FIG. 7 the magnetic field lines 59 emanating from the main pole piece 58 are directed through the cathode 11 so as to pass out of the cathode surface and to loop back through the cathode surface to the lower pole piece 23 and thence through the magnet 57 completing the magnetic circuit defined by the elements and spaces through which the closed magnetic field lines pass. The magnet 57 supplies the magnetomotive force for the magnetic circuit. The main magnetic field lines H and 59 are generally orthogonal to the electric field line indicated by E produced between the cathode 11 and the anode structure and shield 64. Thus, a crossed field magnetron type glow discharge is generated over the conical surface portions of the sputter cathode 11. However, it is found that the discharge also extends into the gap between the upper pole piece 58 and the shield 64. The ion bombardment of the pole piece 58 causes sputtering therefrom which contaminates the sputter deposited coating of cathode material on the work piece. In addition, arc paths are established from the shield 64 to the pole piece 58 and other structure operating at cathode potential, thereby shorting out the sputter gun. If the arcs are of sufficient intensity they can result in destruction of this sputter gun by overheating thereof.

It is believed that the reason that the glow discharge extends into the region between the pole piece 58 and the shield 64 is that the magnetic field lines H passing through this stray glow discharge region have a substantial vector component perpendicular to the electric field lines established between the pole piece and the overlying shield 64. This crossed electric and magnetic field region produces a magnetically enhanced or magnetron type glow discharge in the stray magnetic field region, i.e., in a region of the magnetic field which does not pass through and loop back to the area of the cathode 11 to be sputtered.

Referring now to FIG. 8 there is shown the embodiment of the present invention which includes the auxiliary magnet 62 for shaping the stray magnetic field lines 59' in the region between the sputter shield ring 65 and the clamp 60 so that the glow discharge does not extend into the gap therebetween. It is believed that the bucking magnetic field produced by the auxiliary magnet 62 serves to shape the magnetic field lines 59' in the gap between the shield ring 65 and the clamp 60 to be substantially parallel to the electric field lines extending between the clamp 60 and the shield ring 65. In such a case there is no substantial magnetic field vector orthogonal with the electric field vector so that the glow discharge will be suppressed or not sustained within that annular gap 70. Thus, the bucking magnetic field produced by the auxiliary magnet 62 serves to suppress any undesired stray glow discharge in the gap 70, thereby permitting the sputter gun to strike the glow discharge at a pressure of $2 \times 10^{-3}$ torr as opposed to a pressure one order of magnitude higher, namely $2 \times 10^{-2}$ torr encountered with the sputter gun of FIG. 7. Also, arcing in the region of the stray magnetic field is substantially suppressed. The desired magnetically enhanced or magnetron type glow discharge is limited to the desired effective conical surface of the cathode 11 and to the exposed portion of a flat annular plate portion 79 of the cathode so that pure cathode material is deposited on the work piece. The bucking magnetic field is further shaped in the desired manner, i.e., so that the resultant magnetic field lines 59 are parallel to the electric field lines by also chamfering the inner end of the upper pole piece 63 of the auxiliary magnet structure 62 at 81.

Referring now to FIG. 9 there is shown an alternative embodiment of a cathode structure 82. The cathode structure 82 is for use when the cathode material to be deposited is ferromagnetic. More particularly, the ferromagnetic cathode 82 includes a cylindrical vertical portion 83 of a thickness sufficiently thin so as to be saturated by the magnetic field produced by the main magnetic pole 58 so that the magnetic field lines 59 can pass through the vertical portion 83 and into a horizontal annular portion 84 which can be substantially thicker than the vertical portion 83 since portion 84 does not have to be operated in a saturated mode. In a typical example, the vertical portion 83 is of a thickness as of 1/16 inch, whereas the horizontal plate 84 has a thickness as of ⅜ of an inch. In such a case, the sputter erosion of the cathode 82 is found to occur primarily in the annular region indicated by the dotted line 85.

Referring now to FIG. 10 there is shown an alternative type of magnetically enhanced glow discharge sputter gun apparatus 87 wherein the cathode comprises a circular plate 88 surrounded by an annular anode or ground shield electrode 89. The magnetic structure includes a central magnet 91 surrounded by an annular magnet 92. The magnets 91 and 92 are oppositely polarized so as to produce an annular region of magnetic field passing out of the central regions above the cathode plate 88 and looping back in through the cathode region at the outer periphery into the annular magnet structure 92. The electric field produced between the anode 89 and the cathode 88 produces a crossed electric and magnetic field region above the surface of the cathode 88 resulting in a magnetron type magnetically enhanced glow discharge for bombarding the upper surface of the cathode plate 88 with positive ions for sputtering cathode material onto the work piece to be coated. In such structure, it is found that the stray magnetic field lines passing through the annular gap 93 between the cathode 88 and the anode 89 results in a crossed field glow discharge which can extend into the gap 93 resulting in arcing and sputtering therefrom.

Referring now to FIG. 11 there is shown a structure similar to that of FIG. 10 with the exception that a pair of annular magnetic pole pieces 94 and 95 project radially outward adjacent the gap 93 from opposite ends of the annular magnet 92 for shunting magnetic field away from the gap 93 thereby shaping the magnetic field so as to reduce the magnetic component orthogonal to the electric field within the gap 93 so as to suppress the stray glow discharge which would otherwise form in gap 93. Suppression of the glow discharge in the gap 93 suppresses undesired arcing and sputtering and permits the sputter gun to strike the discharge at a lower pressure than would otherwise be obtained for the embodiment of FIG. 10.

Referring now to FIG. 12 there is shown an alternative embodiment of the stray glow discharge suppression structure of FIG. 11 wherein an auxiliary annular magnet 97 of opposite polarity to that of annular magnet 92 is disposed surrounding magnet 92 in radially spaced relation with the opposite ends of the magnets 92 and 97 being interconnected by means of annular magnetic pole pieces 94 and 95, thereby serving to shunt the magnetic field away from the gap 93 to achieve a result similar to that achieved in the structure of FIG. 11.

While only certain embodiments of the invention have been illustrated and described it is understood that alterations, modifications and changes can be made without departing from the true scope and spirit of the invention as defined by the appended claims.

What is claimed is:

1. Glow discharge sputtering apparatus for coating a work piece including:
   anode and cathode electrode means for operation at independent operating electrical potentials to establish in use a main electric field intercepted by said cathode means;
   said cathode electrode means adapted to contain a main portion made of a material to be sputtered from said cathode means onto the work piece;
   magnet means including a main magnetic circuit for producing a main magnetic field passing out of and looping back into said main cathode portion and a stray magnetic field not intercepted by said main cathode portion and said main magnetic field being crossed with said electric field over said main cathode portion;
   means for applying an operating electrical potential between said anode and cathode means for establishing in operation a main magnetically enhanced glow discharge over said main cathode portion for bombarding said main portion of said cathode means with positive ions to produce sputtering of said cathode material onto the work piece; and
   said magnetic circuit including stray glow discharge suppression means for shaping said stray magnetic field lines in a stray glow discharge region which is otherwise susceptible of supporting a stray glow discharge therein in order to reduce the intensity of said stray glow discharge and stray sputtering generated thereby.

2. The apparatus of claim 1 wherein said stray glow discharge suppression means includes means for shaping the stray magnetic field to be generally parallel to the electric field lines in said stray glow discharge region for suppressing the intensity of said stray glow discharge and for decreasing the resultant stray cathode sputtering generated therefrom.

3. The apparatus of claim 1 wherein said stray glow discharge suppression means includes means for shaping the stray magnetic field to be of substantially of reduced intensity in said stray glow discharge region for suppressing the intensity of said stray glow discharge and for decreasing the resultant cathode sputtering generated therefrom.

4. The apparatus of claim 1 wherein said stray glow discharge suppression means includes an auxiliary source of magnetomotive force for producing an auxiliary magnetic field of a polarity for bucking said stray magnetic field of said main magnetic field in said region of stray glow discharge for shaping the magnetic field in said region of said stray glow discharge for suppressing the intensity of said stray glow discharge and for decreasing the resultant stray cathode sputtering generated therefrom.

5. The apparatus of claim 4 wherein said anode electrode means includes ground shield means disposed in electrically insulative relation to said cathode means for operation in use at an electrical ground potential positive relative to the operating electrical potential of said cathode means; said ground shield means being spaced from and being adjacent to said cathode means to establish a gap therebetween into which said stray magnetic field extends to define said stray glow discharge region.

6. The apparatus of claim 1 wherein said stray glow discharge suppression means includes a magnetic shunt means associated with said magnetic circuit means for shunting a portion of the stray magnetic field from and for shaping the stray magnetic field in said region of stray glow discharge for suppressing the intensity of said glow discharge and for decreasing the resultant stray cathode sputtering generated therefrom.

7. The apparatus of claim 1 wherein, said sputter cathode means is adopted to be made of a ferromagnetic material for bombardment with positive ions generated in the crossed field region over said sputter cathode means for sputtering ferromagnetic material from said sputter cathode means onto a workpiece to be coated; and
   said sputter cathode means including a magnetically saturable first portion of substantially less thickness than a second portion of said cathode so that the magnetic field lines pass through said saturable first portion of said cathode and loop back into said second portion of said cathode.

8. The apparatus of claim 7 wherein said first portion of said cathode comprises at least a portion of a hollow cylindrical structure having a length substantially greater than its wall thickness, and wherein said second portion of said cathode comprises at least a portion of an annular disc.

9. In a glow discharge sputtering method for coating a work piece, the steps of:
   producing crossed magnetic and electric fields over the main surface of a cathode electrode made of a material to be sputtered onto the work piece, such produced magnetic field having a stray magnetic field component disposed over portions of the cathode electrode structure from which sputtering is to be suppressed;
   suppressing the stray sputtering of the cathode electrode structure by shaping the stray magnetic field in the region of the stray glow discharge region so as to substantially reduce the intensity of the stray magnetic field component at right angles to the electric field component in the region of the stray glow discharge, whereby such stray glow discharge is substantially suppressed thereby suppressing undesired cathode sputtering resulting therefrom.

10. The method of claim 9 wherein the step of shaping the stray magnetic field so as to substantially decrease components of stray magnetic field at right angles to the electric field includes the step of shaping the stray magnetic field to be generally parallel to the electric field in the stray glow discharge region.

11. The method of claim 9 wherein the step of suppressing the stray glow discharge includes the step of reducing the intensity of the stray magnetic field in the region of the stray glow discharge for suppressing the intensity of the stray glow discharge.

12. The method of claim 9 wherein the step of suppressing the stray glow discharge includes the step of generating a second magnetic field in the region of the stray magnetic field, such second magnetic field being polarized in opposition to the first field for shaping the magnetic field in the stray glow discharge region to reduce the intensity of the resultant component of magnetic field orthogonal to the electric field in the stray glow discharge region.

13. The method of claim 9 wherein the step of suppressing the stray glow discharge includes the step of shunting a portion of the stray field in the region of the stray glow discharge so as to reduce the intensity of the stray magnetic field component at right angles to the electric field components in the region of the stray glow discharge, whereby the stray glow discharge is suppressed in use.

14. Glow discharge sputtering apparatus for coating a workpiece comprising, a cathode adapted to contain a material to be sputtered, an anode disposed adjacent said said cathode for producing an electric field over a surface of said cathode which is to be sputtered, a first magnetic structure producing a first magnetic field intercepting said cathode and having a substantial component directed orthogonally to the electric field produced between said anode and cathode over the surface of said cathode to be sputtered, second magnetic field means associated with an end region of the first magnetic structure for compressing the end region of the first magnetic field to effectively limit sputtering to the intermediate main area of said cathode, whereby stray sputtering is reduced in use.

15. Glow discharge sputtering apparatus according to claim 14 wherein a second magnetic structure produces said second magnetic field, and said structures are oppositely polarized.

16. Glow discharge sputtering apparatus according to claim 14 including a plate of magnetic material and constituting a first pole piece, means insulating said anode from said plate with said cathode surrounding said anode and electrically connected to said plate, said first magnetic structure being carried by said plate and surrounding said cathode, said first magnetic structure being polarized in a direction normal to said plate, a second pole piece surrounding said cathode and overlying said first magnetic structure, a second magnetic structure producing said second field, the last said structure overlying said second pole piece and polarized in a direction opposite to said first magnetic structure and a third magnetic pole piece overlying said second magnetic structure.

17. Glow discharge sputtering apparatus according to claim 16 wherein said apparatus is disposed within an evacuable chamber and means are provided for the application of a potential difference between said cathode and anode to produce a dark space over the surface of said cathode, and wherein a shield encloses said magnetic structures and extends inwardly toward said cathode.

18. Glow discharge sputtering apparatus according to claim 16 including a fluid cooled jacket surrounding said cathode, said cathode expandable by reason of the heat produced during operation of said apparatus to contact said jacket and dissipate heat thereto.

19. Glow discharge sputtering apparatus according to claim 18 including a hollow anode support extending in insulating relationship through said plate of magnetic material, inlet and outlet liquid conduits communicating with said hollow anode support, inlet and outlet conduits communicating with said cooling jacket and means for circulating a liquid through said jacket and anode support.

20. Glow discharge sputtering apparatus according to claim 16 wherein said first and second magnetic structures each comprise a plurality of permanent magnets.

21. Glow discharge sputtering apparatus according to claim 20 wherein said third pole piece includes a peripheral shield magnetically coupled thereto and extending toward and magnetically coupled to said first pole piece.

22. Glow discharge sputtering apparatus according to claim 21 including a ground shield overlying said third pole piece and insulated therefrom, said shield having an inner edge spaced from said cathode and a peripheral portion spaced from said magnetic structures and electrically connected to said base plate.

23. Glow discharge sputtering apparatus according to claim 22 wherein said ground shield includes a ring disposed about the inner edge thereof, said ring having a tapered surface terminating at its inner edge in spaced relationship to said cathode.

24. Glow discharge sputtering apparatus according to claim 16 including a base plate, a plate of magnetic material overlying said base plate and insulated therefrom, an anode support carried by said base plate and extending in insulating relationship through said plate of magnetic material, said anode being secured to said support with said cathode surrounding said anode and electrically connected to said plate of magnetic material, a plurality of magnets surrounding said cathode and polarized in a direction substantially normal to said plate, said magnets being carried by said plate of magnetic material, said plate of magnetic material forming a first pole piece, a second pole piece overlying said magnets, and producing a magnetic field extending in a curved path through said cathode to said first pole piece, a second magnetic structure overlying said second pole piece and a third pole piece overlying said second set of magnets, said second magnetic structure being polarized in a direction opposite to the polarization of said first magnetic structure and functioning to compress the field thereof substantially to the confines of said cathode.

25. Glow discharge sputtering apparatus according to claim 24 wherein said anode is insulated from said base plate, said cathode includes means for applying a potential negative with respect to said base plate and said anode includes means for applying a potential positive with respect to said base plate whereby said ion and electric currents are made substantially equal.

26. Glow discharge sputtering apparatus according to claim 14 including means for polarizing said cathode negative with respect to ground and said anode positive with respect to ground.

* * * * *